United States Patent
Krijn et al.

(10) Patent No.: US 8,040,040 B2
(45) Date of Patent: Oct. 18, 2011

(54) LIGHT SOURCE AND METHOD OF PROVIDING A BUNDLE OF LIGHT

(75) Inventors: Marcellinu Petrus Carolus Michael Krijn, Eindhoven (NL); Michel Cornelis Josephus Marie Vissenberg, Eindhoven (NL); Peter Alexander Duine, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 652 days.

(21) Appl. No.: 12/064,641

(22) PCT Filed: Aug. 24, 2006

(86) PCT No.: PCT/IB2006/052945
§ 371 (c)(1),
(2), (4) Date: Feb. 25, 2008

(87) PCT Pub. No.: WO2007/026292
PCT Pub. Date: Mar. 8, 2007

(65) Prior Publication Data
US 2008/0253130 A1 Oct. 16, 2008

(30) Foreign Application Priority Data
Aug. 29, 2005 (EP) .................................. 05107877

(51) Int. Cl.
*H05B 33/02* (2006.01)
(52) U.S. Cl. ........................................ 313/501; 445/24
(58) Field of Classification Search .................. 313/512, 313/501; 445/24
See application file for complete search history.

(56) References Cited

U.S. PATENT DOCUMENTS

| | | | |
|---|---|---|---|
| 5,151,756 A | 9/1992 | Nettelbladt et al. | |
| 2002/0141006 A1 | 10/2002 | Pocius et al. | |
| 2004/0141104 A1 | 7/2004 | Yu et al. | |

FOREIGN PATENT DOCUMENTS

| | | | |
|---|---|---|---|
| DE | 10234977 A | 2/2004 | |
| GB | 1409793 A | 10/1975 | |
| JP | 63133684 A | 6/1988 | |
| JP | 09222863 A | 8/1997 | |
| WO | 2004043076 A2 | 5/2004 | |
| WO | 2004088200 A2 | 10/2004 | |
| WO | 2005001331 A1 | 1/2005 | |

OTHER PUBLICATIONS

English Translation of Bogner et al., (WO 2004/088200 A2).*

* cited by examiner

*Primary Examiner* — Joseph L. Williams
*Assistant Examiner* — Hana Featherly
(74) *Attorney, Agent, or Firm* — Mark L. Beloborodov

(57) ABSTRACT

A light source, includes a component (6) for emitting light, arranged to emit a major part of light generated within the component through a face (8) of the component (6), and at least one structure (7;18) for coupling out light, having a base (11;19) in contact with the face (8) of the component (6) and arranged to emit light through an aperture (12;20) opposite the base (11;19). An interface between the component (6) and an environment surrounding the base (7;18) is arranged to keep at least part of the light generated in the component confined to at least a layer of the component (6) adjoining the base (11;19). The base (11; 19) is in contact with the face (8) over an area (A2) smaller than the area ($A_0$) of the face (8).

18 Claims, 3 Drawing Sheets

LIGHT SOURCE AND METHOD OF PROVIDING A BUNDLE OF LIGHT

The invention relates to a light source, including
a component for emitting light, arranged to emit a major part of light generated within the component through a face of the component, and
at least one structure for coupling out light, having a base in contact with the face of the component and arranged to emit light through an aperture opposite the base, wherein an interface between the component and an environment surrounding the base is arranged to keep at least part of the light generated in the component confined to at least a layer of the component adjoining the base.

The invention also relates to a method of providing a bundle of light, including
activating a component for emitting light, arranged to emit a major part of light generated within the component through a face of the component, such that at least part of the light generated in the component is reflected at at least part of the face of the component.

The invention also relates to an optical apparatus comprising a light source and an optical system for accepting light from the light source.

It is known to cover the die of a Light-Emitting Diode (LED) with a silicone encapsulant. On top of that, a plastic cover is located. Apart from protecting the die and encapsulant, it also serves the purpose of a beam-shaping element. Depending on the application, the beam can be shaped such that the LED emits mainly in a forward direction, i.e. away from the face of the component for emitting of light.

A problem of the known configuration is that, when it is incorporated in a lighting apparatus with a further optical system for gathering the light from the light source, the amount of useful light remains limited. This problem is due to the limited étendue of the system gathering the light, and comes to the fore when the light source is incorporated in relatively compact lighting apparatus.

It is an object of the invention to provide a Light source, method of providing a bundle of light and optical apparatus for providing a relatively large throughput of light through an optical system capturing light from the light source.

This object is achieved by the light source according to the invention, which is characterized in that the base is in contact with the face over an area smaller than the area of the face.

The light source forms a source of light with relatively large brightness, defined as the luminous intensity per unit of surface area (A) of the light-emitting surface emitted into a solid angle ($\Omega$). Because the base of the structure for coupling out light is in contact with the face of the component for emitting light over an area substantially smaller than the area of the face, the light-emitting area is reduced, tending to increase the brightness. Because the interface between the component and an environment surrounding the base is arranged to keep at least part of the light generated in the component confined to at least a layer of the component adjoining the base, light that is not directly coupled out will be reflected at the interface and then coupled out. For this reason, the intensity of light does not decrease proportionally to the decrease in surface area due to the fact that the structure for coupling out light is only in contact with the component over a fraction of the latter's surface area.

It is observed that WO 2005/001331 discloses a luminous body comprising a housing. The light is issued at a light emission surface which closes off the housing at its upper side. At the lower side of the housing, a plurality of light sources has been inserted. The light sources are composed of LED elements with electrical contacts and respective lens bodies provided thereon, from which the light is issued in lateral directions. The surfaces of the lens bodies facing (opposed to) the light emission surface of the housing are each coated with a reflecting layer which reflects back those light component which are inevitably also radiated in axial direction of the LED elements. The spatial radiation characteristics of the luminous body are essentially determined by the shape and gradient of the light emission surface and usually exhibit a Lambert-type character. WO 2005/001331 does not disclose a light source including a structure for coupling out light having a base in contact with the face of a component for emitting light and arranged to emit light from a surface opposite the base. The reflective layer of the lens bodies precludes the formation of a bundle of light. The known luminous body serves to distribute the light originating from more or less point-shaped light sources as evenly as possible over a light-emitting surface.

In a preferred embodiment, at least a layer of the component adjoining the base has an index of refraction larger than one.

Thus, for a planar component for emitting light, total internal reflection at the interface to the environment of the component for emitting light will tend to keep the light confirmed to the component. Application of a reflective coating around the base is not essential to keeping at least part of the light generated in the component confined to at least a layer of the component adjoining the base in this embodiment, making manufacturing easier.

An embodiment of the light source according to the invention includes a plurality of the structures for coupling out light, each having a base in contact with the face over an area substantially smaller than the area of the face.

This embodiment has the advantage of being able to provide a relatively large amount of light. The plurality of light structures each provide light at a relatively large brightness. Each has a sufficiently low étendue, the product of the solid angle in which light is emitted and the light-emitting area, that a relatively large part of the emitted light is captured by optical components in series with the light source.

An embodiment of the light source includes at least one arrangement for collimating at least the light passing through one of the structures for coupling out light.

The effect is to decrease the solid angle into which light is emitted further, whilst essentially preserving the étendue, which ensures that a large part of the emitted light is captured by any of a large number of different optical components that may be placed in series with the light source.

In a variant, at least one of the structures for coupling out light includes a collimating system integral thereto.

For small-scale light sources, this makes assembly less complicated, in particular alignment.

In a variant, at least one lenslet is provided over the respective apertures opposite the bases of the structure for coupling out light.

This allows the use of relatively simple to manufacture structures for coupling out light.

In an embodiment, the aperture opposite the base has a larger area than the base.

This ensures that relatively little light is lost in a structure for coupling out light. Light emitted through the area of contact over a relatively large solid angle is coupled out. This will be apparent by considering the fact that the structure for coupling out light is an étendue-preserving structure.

In an embodiment, the component for emitting light includes a layered device including one or more active layers for converting electrical current into light, at least one further layer, transparent in a range of frequencies of light generated in the component and having a smaller absorption coefficient in that range than the active layers.

This has the effect that light is easily "spread" out in lateral directions, allowing a relatively large fraction of the generated light to reach the or an area of contact with the or a structure for coupling out light, instead of being absorbed in the device for emitting light. This is especially advantageous where the component is a Light-Emitting Diode (LED), because the active materials used in solid-state LEDs generally have a relatively high coefficient of absorption.

In a variant, the component for emitting light includes a layered device including one or more active layers for converting electrical current into light and at least one layer between the face of the component and the active layers, comprising a luminescent material.

The effect is to increase the range of colors of light which the light source can be configured to produce. In particular where the component for emitting light comprises an LED, the active layers can be configured to emit blue light, for example, which the luminescent material converts into green or red light. The converted light is emitted with a relatively high brightness, making the light source suitable for use in displaying images.

In an embodiment, the component for emitting light includes a layered device, wherein at least one of the structures for coupling out light is integral with a layer of the component adjoining its base.

This obviates the need for intricate assembly of the structures and the component, making the light source suitable for miniaturization.

In an embodiment, a reflecting surface is provided opposite the face of the component for emitting light.

This increases the yield of the light source.

In an embodiment, the component for emitting light is formed by a light-emitting diode die.

This embodiment combines the favorable aspects of light-emitting diodes without the limited brightness of the light-emitting diode on its own.

According to another aspect, the method of providing a bundle of light according to the invention is characterized by coupling out light through at least one structure having a base in contact with the face over an area smaller than the area of the face.

An embodiment includes activating the component in an environment having an index of refraction substantially lower than the component for emitting light.

Thus, it is ensured that total internal reflection will occur at the interface of the component for emitting light to its environment. Due to this, a relatively large part of the light generated in the component will be emitted through the structure for coupling out light.

According to another aspect, the light source in the optical apparatus according to the invention is formed by a light source according to the invention.

Preferably, the optical system has an acceptance larger than the étendue of the light source.

In this context, acceptance means the product of the solid angle over which incoming light is captured and the light-capturing area. Because it is larger than the étendue of the light source, the maximum amount of light is captured.

The invention will now be explained in further detail with reference to the accompanying drawings, in which, FIG. 1 shows an assembly of components for an optical apparatus;

Figure 1:
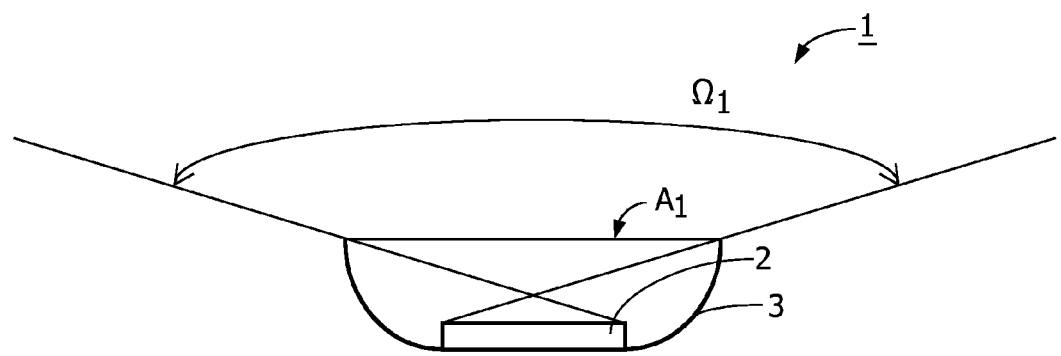

An optical assembly 1 is shown in FIG. 1, and comprises a light source 2 and reflector arrangement 3. The light source 2 is not shown in exact detail, as several possible embodiments will be discussed below. The reflector arrangement 3 captures the light emitted when the light source is energized. The reflector arrangement has a solid opening angle $\Omega_1$ and light-capturing surface $A_1$. Thus, the acceptance of the reflector arrangement 3 equals $\Omega_1 \cdot A_1$. Instead of the reflector arrangement 3, a lens or combination of lenses could have been used. The light source 2 has an étendue smaller than the acceptance $\Omega_1 \cdot A_1$, to ensure that substantially all of the light emitted by it passes through the optical assembly 1. The optical assembly 1 is located in an environment consisting essentially of air. In alternative embodiments, the environment may be formed by another gas or gas mixture. The optical assembly 1, or at least the light source 2, may also be placed in a liquid or solid medium, provided the medium has a lower index of refraction than the material of the light source 2.

Applications of the optical assembly include projectors, also known as beamers. The light source 2, as will be explained, emits light of a relatively high brightness, meaning it is well-suited to use in compact devices, since the opening angle and/or light-capturing area of the optical system in series with the light source 2 can be relatively small. Another application of the light source 2 is matrix illumination. In essence, this is a flat pixelated lamp that projects pixels onto a surface to be illuminated. Such a lamp can be used to convey a mood or display non-alphanumerical information. It can also be used to enhance the viewing experience when watching television by using it as ambient lighting that extends the image outside the boundaries of the television screen. Other applications include LED-based backlights for liquid crystal displays and LED-based headlights for vehicles. These advantageously make use of the relatively long lifetime of LEDs and low operating voltage, as well as their relatively low costs. The drawback of limited brightness is removed by incorporating the LED as a component for emitting light in the light source 2 that is described herein.

Figure 2:
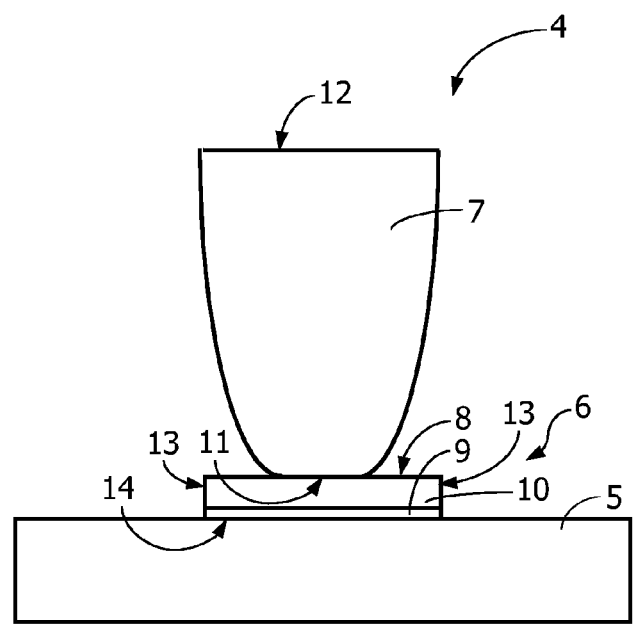
FIG. 2 is a schematic illustration of an embodiment of a light source with integrated collimator.

The general build-up of a first light source 4 is shown in FIG. 2. The first light source 4 comprises a heat sink 5 and an LED die 6, as an example of a component for emitting light. A first structure 7 for coupling out light generated within the component for emitting light is attached to the component for emitting light. In the illustrated embodiment, only one first structure 7 for coupling out light is attached to an upper surface 8 of the LED die 6. In alternative embodiments, several of the first structures 7 may be arranged in an array on the upper surface 8. The first structure 7 increases the brightness of light emitted by the component for emitting light.

The component for emitting light can be based on one of a number of different mechanisms for generating light when powered by electrical current. In the example of FIG. 2, as in all examples illustrated herein, it comprises the LED die 6, which comprises a number of active layers, indicated generally by reference numeral 9. In one embodiment, the layers 9 comprise $In_xGa_{1-x}N$, with x varying from layer to layer. The index of refraction of the active layers has a value of around 2.5 in that case. The active layers 9 have a total thickness in the order of several μm, for instance 5 μm. The active layers 9 are covered by a substrate 10 made of sapphire, which has an index of refraction of about 1.8. The substrate has a thickness one or two orders of magnitude higher than that of the stack of active layers, for instance 100 μm. An LED has a number of attractive properties, which include the long lifetime, low operating voltage, small form factor, almost pure spectral colors, fast modulation of lumen output, and the fact that it turns on instantaneously when energized. The first structure 7 for coupling out light increases the inherently low brightness of the LED die 6.

The first structure 7 for coupling out light comprises a transparent medium having a relatively high index of refraction. It approximates that of the substrate 10 and/or active layers 9 more closely than the value of the index of refraction of the environment of the light source, i.e. air. Suitable materials include glass, quartz, sapphire and transparent ceramics. In FIG. 2, the first structure 7 for coupling out light has the shape of a collimator, namely a concentric-parabolic-concentrator. Thus, it comprises an integral system for collimating light. A base 11 of the first structure 7 for coupling out light is in contact with the upper surface 8, and has an area $A_2$. Light enters the first structure 7 for coupling out light through the base 11 and exits through an opposite light-emitting surface 12 with an area $A_3$. The area $A_3$ is substantially larger than the area $A_2$ of the base. This area $A_2$ is a fraction of the total area $A_0$ of the upper surface 8, in order to increase the brightness.

The brightness of emitted light is increased because the light flux does not decrease proportionally to the area $A_2$ of the upper surface 8 through which light is coupled out. The light flux decreases less than might be expected, due to at least partial reflection at side surfaces 13 and a lower surface 14. In the case of the side surfaces 13, this is due to the fact that the environment of the LED die 6 has a lower index of refraction than the substrate 10 and active layers 9, so that total internal reflection acts to keep a substantial part of the light confined to the substrate 10. In the case of the lower surface 14, this is enhanced by the presence of a surface layer of reflective material (not shown in detail). The part of the upper surface 8 surrounding the base 11 may also be coated with a surface layer of reflective material. Alternatively, only part of the light generated in the active layers 9 may be reflected at the interface to the air surrounding the base 11, namely that part incident on the surface at angles in a sub-range of the total geometrically possible range. This is the range of angles to the normal exceeding the critical angle. There is little emission through the side surfaces 13, as the active layers 9 tend to absorb most of the generated light propagating in that direction. Moreover, the LED die 5 is planar, so that the area of the side surfaces 13 is small compared to that of the upper surface 8.

The brightness B of the light source is given by the following equation:

$$B = \frac{\Phi}{\pi \cdot A}, \quad (1)$$

wherein Φ is the luminous flux (in lumen). This equation is based on a Lambertian pattern of emission.

To estimate the effect of coupling out light through an area $A_2$ smaller than a total area $A_0$ of the upper surface 8, the brightness was modeled analytically using the following equation:

$$\Phi = \frac{A_2}{A_0} \cdot \frac{1}{1 - R_b\left(1 - \frac{A_2}{A_0}\right)} \cdot \Phi_0, \quad (2)$$

wherein $\Phi_0$ is the luminous flux when $A_2=A_0$. $R_b$ is an effective reflection factor accounting for losses caused by non-ideal reflection of light from the bottom of the LED die 6 and implicitly accounting for re-absorption of light in the active layers 9.

In a practical example, the area A0 of the upper surface 8 is 1 mm² and the area $A_2$ of the base 11 is 0.2 mm². Using equation (2), one can estimate that the brightness $B=2.3 \, B_0$ for $R_b=0.7$. The luminous flux Φ equals $0.45 \cdot \Phi_0$.

Figure 3:
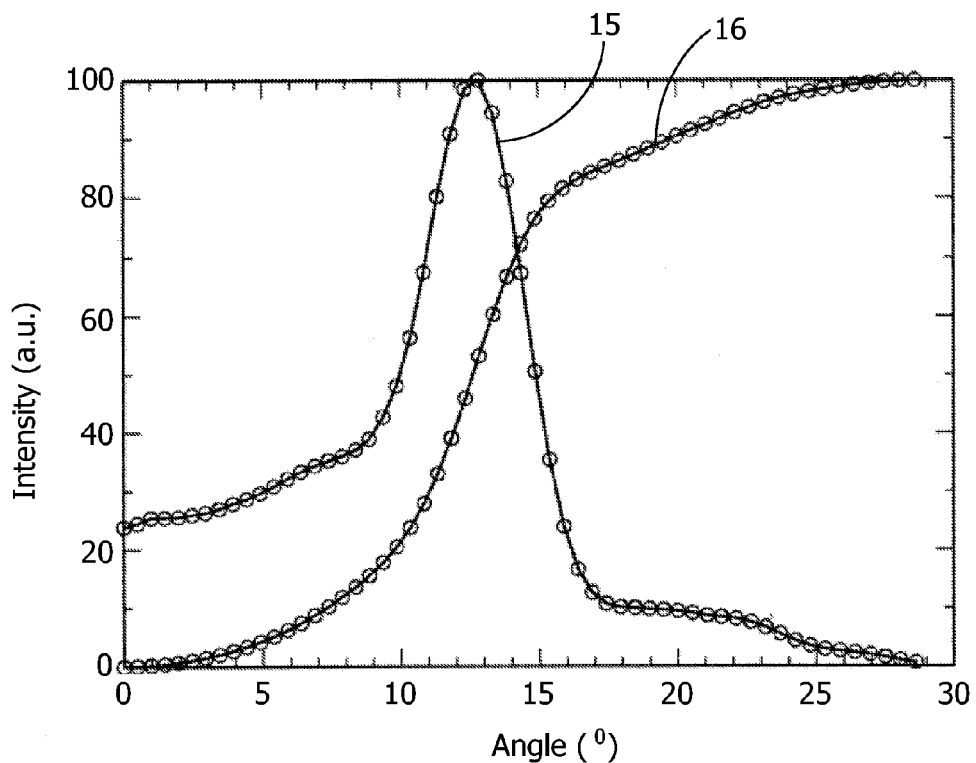
FIG. 3 is a graph showing the results of a calculation of the intensity of light emitted by a light source having the build-up of that shown in FIG. 2, using a ray-tracing simulation.

This result has been confirmed using ray-tracing calculations in an optical simulation package (ASAP from Breault Research). The LED die 6 was modeled as two boxes with a reflective layer over the lower surface 14. The active layers 9 were modeled as a box of 1×1×0.01 mm³, having a refractive index n=2.5. The substrate was modeled as a box of 1×1×0.1 mm³, having a refractive index n=1.8. The reflective layer is assumed to be an aluminum electrode having a reflectivity ρ=0.8. Light generation in the active layers 9 was modeled by adding two Lambertian emitting planes in back-to-back configuration. FIG. 3 shows the results of the simulation. A first curve 15 shows the angular distribution of the normalized intensity. A second curve 16 shows the integrated intensity. From the figure, it follows that 50% of the light resides within an angular cone of 2×13°=26°. For this simulation, the entrance diameter of the first structure 7 for coupling out light was set at 0.5 mm. The diameter of the light-emitting surface 12 was set at 3 mm. The simulation confirmed the results obtained by using equation (2), in that they gave $\Phi=0.46 \cdot \Phi_0$ and $B=2.2 \cdot B_0$.

Figure 4:
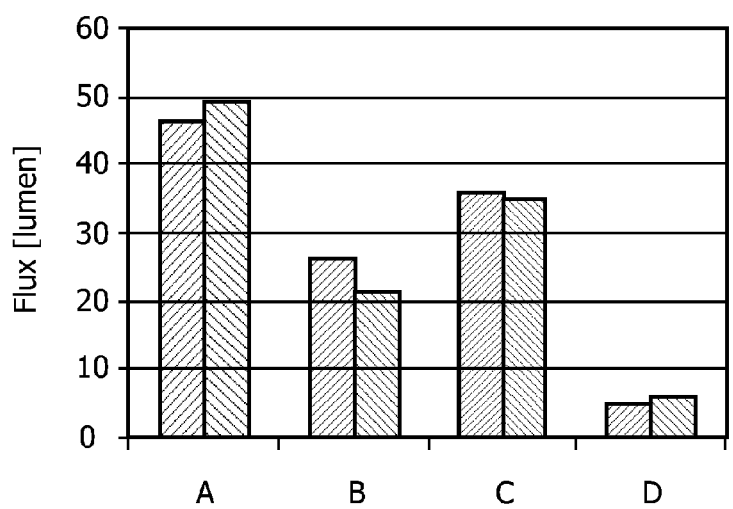
FIG. 4 is a graph comparing the intensity calculated for several light sources with that determined experimentally.

To confirm the simulations, measurements were made on some actual light sources. The results of these measurements are illustrated in FIG. 4. For each of four quantities A-D, the left-hand bar represents the measured flux (in lumen), whereas the adjacent bar represents the flux obtained from the simulation. A is the flux output from a LED die with a conventional collimator that completely encapsulates the LED die 6, i.e. both the upper surface 8 and side surfaces 13. B represents the flux output of the LED die 6 without any encapsulation. C represents the flux output through the light emitting surface of the first structure 7 for coupling out light. D is the flux output lost through the side surfaces 13. This loss is due to the fact that total internal reflection does not occur over the full range of angles. In fact, the light impinging on the side surfaces 13 tends to be incident at an acute angle, since the component for emitting light is planar. FIG. 4 confirms the results obtained through simulation and shows that these results are not inherently biased.

Figure 5:
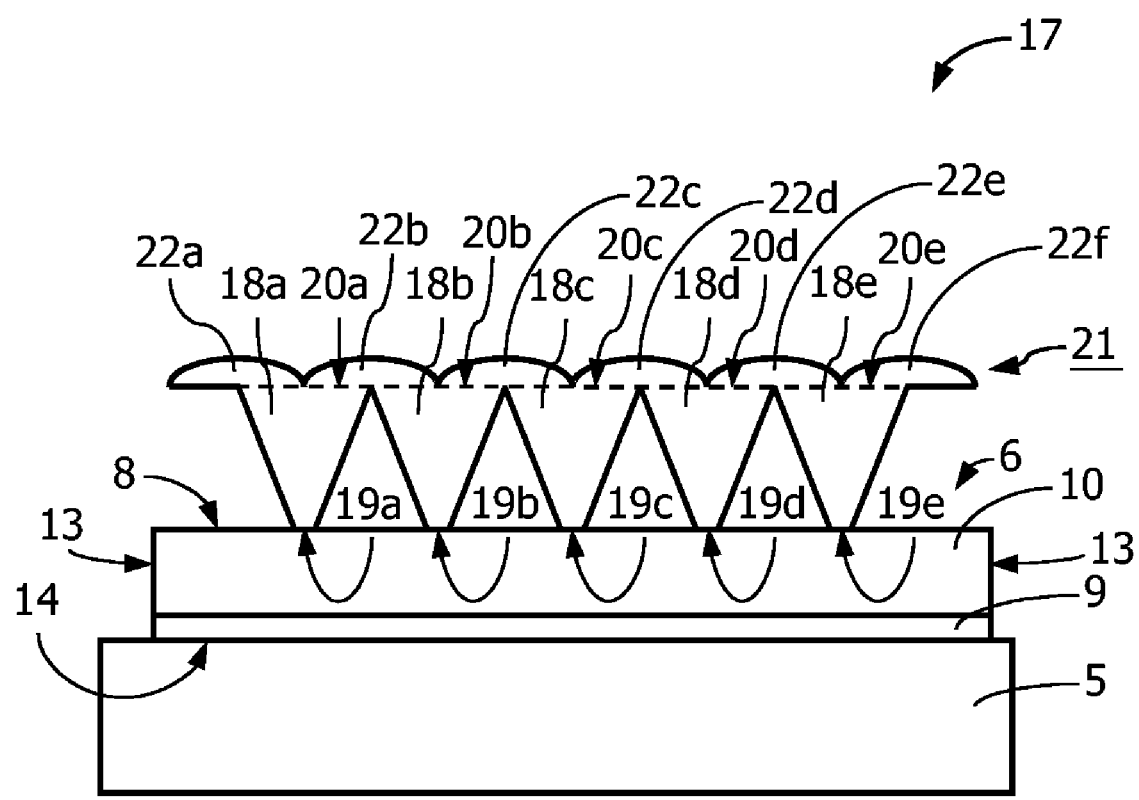
FIG. 5 is a schematic illustration of an embodiment of a light source comprising an array of structures for coupling out light.

A second light source 17, operating in the same way as the first light source of FIG. 2, is shown in FIG. 5. The component for emitting light is the same. Corresponding parts have been numbered in the same way as in FIG. 2. The second light source 17 includes a plurality of second structures 18a-18e for coupling out light through the upper surface 8 of the LED die 6. The second structures 18a-18e have the shape of an inverted cone. Respective bases 19a-19e of the second structures 18a-18e are in contact with the upper surface 8 over areas $A_2$ substantially smaller than the total area $A_0$ of the upper surface 8. Each has an exit aperture 20a-20e opposite its base 19a-19e with a larger area than the base 19a-19e opposite it. The index of refraction of the second structures is matched to that of the substrate 10, whereas the upper surface 8 has an interface to air over the area surrounding the bases 19a-19e. A medium other than air may fill the interstices between the second structures 18a-18e for coupling out light.

An array 21 of lenslets 22a-22f is arranged over the exit apertures 20a-20e. The lenslets 22a-22f and second structures 18a-18e for coupling out light form an integral component in the illustrated embodiment. In other variants, the array 21 may be bonded to the second structures 18a-18e. In another variant, the array of second structures 18a-18e for coupling out light is integral with the substrate 10.

It should be noted that the above-mentioned embodiments illustrate, rather than limit, the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The first structure 7 for coupling out light may, for instance, be comprised in an array of similar structures in a configuration similar to that of the second structures 18a-18e. The active layers 9 may include an organic light-emitting material. In a variant, transparent, ceramic layer of luminescent material is provided in the place of the substrate 10. Such a component for emitting light is known as a P-converted LED. Thus, light-generation in the topmost layer of the component for emitting light is not precluded.

The invention claimed is:

1. A device, comprising:
    a component for emitting light, arranged to emit a major part of light generated within the component through a light-emitting surface of the component; and
    at least one structure for coupling out light, having a base in contact with the light-emitting surface of the component and arranged to emit light through an aperture opposite the base, the aperture having a larger area than the base, wherein an interface between the component and an environment surrounding the base is arranged to keep at least part of the light generated in the component confined to at least a layer of the component adjoining the base, and wherein the base is in contact with the light-emitting surface of the component over an area that is substantially smaller than the area of the light-emitting surface of the component.

2. The device of claim 1, wherein at least a layer of the component adjoining the base has an index of refraction larger than one.

3. The device of claim 1, including at least one arrangement for collimating at least the light passing through the at least one structure for coupling out light.

4. The device of claim 3, wherein the at least one structure for coupling out light includes a collimating system integral thereto.

5. The device of claim 3, wherein at least one lenslet is provided over the at least one structure for coupling out light opposite the base of the at least one structure for coupling out light.

6. The device of claim 1, wherein the component for emitting light includes:
    one or more active layers for converting electrical current into light; and
    at least one layer between the light-emitting surface of the component and the active layers, comprising a luminescent material.

7. The device of claim 1, wherein the component for emitting light includes a layered device, wherein at least one of the at least one structures for coupling out light is integral with a layer of the component adjoining its base.

8. The device of claim 1, wherein the component further includes a back surface provided opposite the light-emitting surface, and wherein a light-reflecting material is provided on the back surface.

9. The device of claim 1, wherein the component for emitting light comprises a light-emitting diode die.

10. The device of claim 1, wherein the component for emitting light comprises:
    one or more active layers for converting electrical current into light; and
    a transparent substrate in a range of frequencies of light generated in the component and having a smaller absorption coefficient in that range than the active layers, wherein the light-emitting surface of the component is a surface of the transparent substrate.

11. The device of claim 1, wherein the base is in contact with the light-emitting surface of the component over an area that is no more than 20% of the area of the light-emitting surface of the component.

12. A light source, including
    a component for emitting light, arranged to emit a major part of light generated within the component through a face of the component, and
    at least one structure for coupling out light, having a base in contact with the face of the component and arranged to emit light through an aperture opposite the base, the aperture having a larger area than the base, wherein an interface between the component and an environment surrounding the base is arranged to keep at least part of the light generated in the component confined to at least a layer of the component adjoining the base, wherein the base is in contact with the face over an area ($A_2$) smaller than the area ($A_0$) of the face, wherein the at least one structure includes a plurality of the structures for coupling out light, each having a base in contact with the face over an area substantially smaller than the area of the face.

13. The device of claim 12, wherein the component for emitting light comprises:
    one or more active layers for converting electrical current into light; and
    a transparent substrate in a range of frequencies of light generated in the component and having a smaller absorption coefficient in that range than the active layers, wherein the light-emitting surface of the component is a surface of the transparent substrate.

14. A method of providing a bundle of light, including
    activating a component for emitting light, arranged to emit a major part of light generated within the component through a light-emitting surface of the component, such that at least part of the light generated in the component is reflected at least part of the light-emitting surface of the component; and
    coupling out light through at least one structure having a base in contact with the light-emitting surface over an area ($A_2$) that is substantially smaller than the area ($A_0$)

of the light-emitting surface, wherein the component and structure comprise a light source, the method further comprising passing light from the light source through a reflector arrangement having an acceptance larger than the étendue of the light source, wherein substantially all of the light emitted by the light source passes through the reflector arrangement.

15. The method of claim 14, including providing an environment in which to activate the component having an index of refraction substantially lower than an index of refraction of the component for emitting light.

16. The method of claim 14, wherein coupling out light through at least one structure comprises coupling out light through a plurality of the structures each having a base in contact with the light-emitting surface over an area smaller than the light-emitting surface.

17. A device, comprising:
   a component for emitting light, arranged to emit a major part of light generated within the component through a light-emitting surface of the component; and
   at least one structure for coupling out light, having a base in contact with the light-emitting surface of the component and arranged to emit light through an aperture opposite the base,
   wherein an interface between the component and an environment surrounding the base is arranged to keep at least part of the light generated in the component confined to at least a layer of the component adjoining the base, and wherein the base is in contact with the light-emitting surface of the component over an area that is substantially smaller than the area of the light-emitting surface of the component,
   wherein the component and structure comprise a light source, the device further comprising an optical system configured to accept light from the light source, wherein the optical system has an acceptance larger than the étendue of the light source.

18. The device of claim 17, wherein the optical system comprises a reflector arrangement configured to accept light from the light source, the reflector arrangement having an acceptance larger than the étendue of the light source, wherein substantially all of the light emitted by the light source passes through the reflector arrangement.

* * * * *